(12) United States Patent
Hwang

(10) Patent No.: US 8,717,810 B2
(45) Date of Patent: May 6, 2014

(54) PHASE CHANGE MEMORY DEVICE AND COMPUTING SYSTEM HAVING THE SAME

(75) Inventor: Joo-young Hwang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 74 days.

(21) Appl. No.: 13/562,650

(22) Filed: Jul. 31, 2012

(65) Prior Publication Data

US 2013/0058160 A1  Mar. 7, 2013

(30) Foreign Application Priority Data

Sep. 1, 2011  (KR) ........................ 10-2011-0088592

(51) Int. Cl.
*G11C 11/00* (2006.01)

(52) U.S. Cl.
USPC ............................ 365/163; 365/158; 365/161

(58) Field of Classification Search
USPC ........................................... 365/45, 100, 191
See application file for complete search history.

(56) References Cited

U.S. PATENT DOCUMENTS

| | | | | |
|---|---|---|---|---|
| 5,949,734 A * | 9/1999 | Matano | ..................... | 365/230.03 |
| 6,072,732 A * | 6/2000 | McClure | ....................... | 365/191 |
| 6,545,909 B2 * | 4/2003 | Tanaka et al. | ............ | 365/185.03 |
| 7,471,556 B2 | 12/2008 | Chow et al. | | |
| 2004/0225829 A1 | 11/2004 | Akiyama et al. | | |
| 2008/0291727 A1 | 11/2008 | Seo et al. | | |
| 2009/0235036 A1 | 9/2009 | Ro et al. | | |

FOREIGN PATENT DOCUMENTS

| | | |
|---|---|---|
| JP | 2004-334996 A | 11/2004 |
| KR | 10-0909965 B1 | 7/2009 |
| KR | 2009-0098228 A | 9/2009 |

* cited by examiner

*Primary Examiner* — Tan T. Nguyen
(74) *Attorney, Agent, or Firm* — Harness, Dickey & Pierce

(57) ABSTRACT

A phase change memory device includes a memory cell array, a register unit and a control unit. The memory cell array includes a plurality of phase change memory cells. The register unit includes a circular queue. The control unit receives a write address and a write data in a write mode, programs the write data in a phase change memory cell corresponding to the write address among the plurality of phase change memory cells, provides the write address and the write data to the register unit, and outputs a write complete signal before a phase of the phase change memory cell is stabilized or after the phase of the phase change memory cell is stabilized based on a logic level of a first result signal received from the register unit. The phase change memory device increases a programming speed.

20 Claims, 6 Drawing Sheets

PHASE CHANGE MEMORY DEVICE AND COMPUTING SYSTEM HAVING THE SAME

CROSS-REFERENCE TO RELATED APPLICATION(S)

This application claims priority under 35 USC §119 to Korean Patent Application No. 10-2011-0088592, filed on Sep. 1, 2011 in the Korean Intellectual Property Office (KIPO), the contents of which are herein incorporated by reference in their entirety.

BACKGROUND

1. Technical Field

Example embodiments relate to a semiconductor memory device, and more particularly to a phase change memory device and/or a computing system including the phase change memory device.

2. Description of the Related Art

Semiconductor memory devices for storing data may be classified into volatile memory devices and non-volatile memory devices. The volatile memory devices are typically configured to store data by charging or discharging capacitors in memory cells, and widely used as main memories of various apparatuses. The volatile memory devices such as Dynamic Random Access Memory (DRAM) and Static Random Access Memory (SRAM) retain stored data while power is supplied and lose the stored data when power is off.

The non-volatile memory devices such as flash memory devices may maintain stored data even though power is off, and are widely used for storing program codes and/or data in computers, mobile devices, etc.

According to demands for high memory capacity, high operational speed and low power consumption of the memory devices, new memory devices of various types have been developed to realize high integration rate of DRAM, high speed of SRAM and non-volatility of flash memory in a single memory device. For example, Phase Change Random Access Memory (PRAM) using phase change materials, Resistance Random Access Memory (RRAM) using materials having variable resistance such as transition-metal oxides, and Magnetic Random Access Memory (MRAM) using ferromagnetism materials are attracting attention as memory devices of the next generation. Such materials have common characteristics that a resistance thereof is variable depending on magnitude and/or direction of applied voltage and/or current, and that the resistance can be maintained (that is, non-volatility) even though the applied voltage and/or current is intercepted and thus refresh operation is not required.

Each memory cell of the resistive memory devices may be formed with one resistive element and one switching element so that data may be stored by controlling voltage and/or current of a bit line and a word line to change resistance of the resistive element.

Because much time is required to program data in the resistive memory devices, particularly in the PRAM device, it is desirable to increase a programming speed of the resistive memory devices.

SUMMARY

Some example embodiments are directed to provide a phase change memory device that increases a programming speed.

Some example embodiments are directed to provide a computing system including the phase change memory device.

According to an example embodiment, a phase change memory device includes a memory cell array, a register unit and a control unit. The memory cell array includes a plurality of phase change memory cells. The register unit includes a circular queue. The control unit is configured to receive a write address and a write data in a write mode, to program the write data in a phase change memory cell among the plurality of phase change memory cells based on the write address, to provide the write address and the write data to the register unit, and to output a write complete signal before a phase of the phase change memory cell is stabilized or after the phase of the phase change memory cell is stabilized based on a logic level of a first result signal received from the register unit.

In one example embodiment, the register unit may be configured to provide the first result signal having a first logic level to the control unit when the register unit writes the write address and the write data in the circular queue, and to provide the first result signal having a second logic level to the control unit when the register unit does not write the write address and the write data in the circular queue.

In one example embodiment, the control unit may be configured to output the write complete signal before the phase of the phase change memory cell is stabilized when the first result signal has the first logic level, and to output the write complete signal after the phase of the phase change memory cell is stabilized when the first result signal has the second logic level.

In one example embodiment, the control unit may be configured to generate a deadline time by adding a stabilization time to a current time and to provide the current time and the deadline time to the register unit when the control unit starts to program the write data in the phase change memory cell, where the stabilization time is a time required for the phase of the phase change memory cell to be stabilized from a start of the programming.

In one example embodiment, each entry included in the circular queue may include an address field configured to store the write address, a data field configured to store the write data, and a deadline field configured to store the deadline time.

In one example embodiment, the register unit may be configured to compare the current time with an oldest deadline time, which is read from the deadline filed of an oldest entry in the circular queue, to determine the logic level of the first result signal.

In one example embodiment, the register unit may be configured to provide the first result signal having a first logic level to the control unit and to store the write address, the write data and the deadline time in the address field, the data field and the deadline field of the oldest entry in the circular queue, respectively, when the current time is equal to or later than the oldest deadline time, and to provide the first result signal having a second logic level to the control unit without storing the write address, the write data and the deadline time in the circular queue when the current time is earlier than the oldest deadline time.

In one example embodiment, the control unit may be configured to receive a read address in a read mode, and to output one of a register data read from the circular queue and a cell data read from the memory cell array as a read data based on whether the read address is stored in the circular queue.

In one example embodiment, the control unit may be configured to receive a read address in a read mode, to perform a read operation on a phase change memory cell corresponding to the read address among the plurality of phase change memory cells, and to provide the read address to the register unit.

In one example embodiment, the register unit may be configured to provide a second result signal having a first logic level and a register data, which is read from the data field of an entry storing the read address in the circular queue, to the control unit when the circular queue stores the read address, and to provide the second result signal having a second logic level to the control unit when the circular queue does not store the read address.

In one example embodiment, the control unit may be configured to output the register data received from the register unit as a read data when the second result signal has the first logic level, and to output a cell data received from the memory cell array as a result of the read operation as the read data when the second result signal has the second logic level.

In one example embodiment, the control unit may be configured to stop the read operation when the second result signal has the first logic level.

According to an example embodiment, a computing system includes a phase change memory device and a processor. The phase change memory device includes a plurality of phase change memory cells. The processor is configured to control an operation of the phase change memory device. The phase change memory device is configured to receive a write address, a write data and a write control signal from the processor in a write mode, programs the write data in a phase change memory cell among the plurality of phase change memory cells based on the write address, and to provide a write complete signal to the processor before a phase of the phase change memory cell is stabilized or after the phase of the phase change memory cell is stabilized based on a logic level of the write control signal.

In one example embodiment, the computing system may further include a system memory configured to store a data required for an operation of the processor. The processor may be configured to provide the write control signal having a first logic level to the phase change memory device when the write data is stored in the system memory, and to provide the write control signal having a second logic level to the phase change memory device when the write data is not stored in the system memory.

In one example embodiment, the phase change memory device may be configured to provide the write complete signal to the processor before the phase of the phase change memory cell is stabilized when the write control signal has the first logic level, and to provide the write complete signal to the processor after the phase of the phase change memory cell is stabilized when the write control signal has the second logic level.

According to an example embodiment, a phase change memory may be configured to transmit, in response to writing received data to a phase change memory cell of a memory cell array based on a received address, a write complete signal one of (1) before a phase of the phase change memory cell is stabilized and (2) after the phase of the phase change memory cell is stabilized if a deletable entry does not exists in a circular queue of a register unit.

BRIEF DESCRIPTION OF THE DRAWINGS

Example embodiments will be more clearly understood from the following brief description taken in conjunction with the accompanying drawings.

FIG. 1 is a diagram illustrating a phase change memory cell included in a phase change memory device according to an example embodiment.

FIG. 2 is a graph illustrating model temperature profiles for a phase change memory cell as applied during a program operation.

FIG. 3 is a graph illustrating a state change for a phase change material within a phase change memory cell.

FIG. 4 is a block diagram illustrating a phase change memory device according to an example embodiment.

FIG. 5 is a diagram illustrating a circular queue included in a register unit of FIG. 4 according to an example embodiment.

FIG. 6 is a block diagram illustrating a multiplexer included in a control unit of FIG. 4 according to an example embodiment.

FIG. 7 is a block diagram illustrating a phase change memory device according to an example embodiment.

FIG. 8 is a flow chart illustrating a method of programming and reading a phase change memory device according to an example embodiment.

FIGS. 9 and 10 are block diagrams illustrating a computing system according to an example embodiment.

Figure 1:
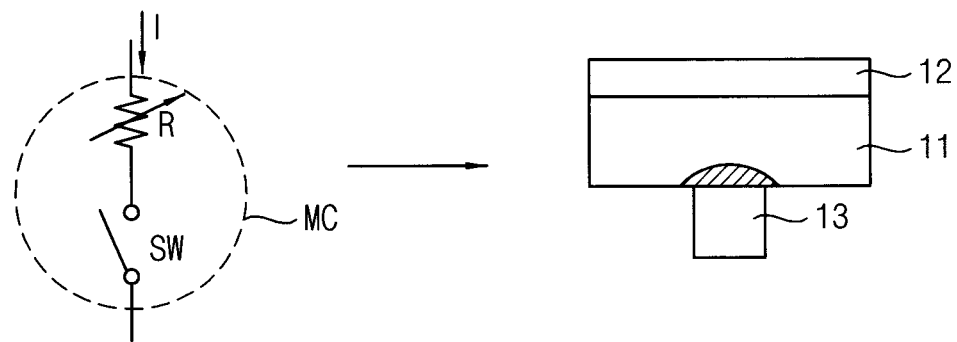
FIGS. 1-9 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF THE EMBODIMENTS

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a diagram illustrating a phase change memory cell included in a phase change memory device according to an example embodiment.

Referring to FIG. 1, a phase change memory cell MC 10 may include a resistive element R and a switching element SW. The switching element SW may be implemented with various elements such as metal oxide semiconductor (MOS) transistor and a diode. As illustrated in a right part of FIG. 1, the resistive element R may include a phase change layer 11, which may include a phase change material, an upper electrode 12 that may be formed above the phase change layer 11, and a lower electrode 13 that may be formed below the phase change layer 11.

The phase change material included in phase change layer 11 may include binary compounds, such as GaSb, InSb, InSe, Sb2Te3, or GeTe, ternary compounds, such as, GeSbTe, GaSeTe, InSbTe, SnSb2Te4, or InSbGe, and 4-ary compounds, such as AgInSbTe, (GeSn)SbTe, GeSb(SeTe), or Te81Ge15Sb2S2. Among them, GeSbTe consisting of germanium (Ge), antimony (Sb), and tellurium (Te) may be used in particular. Hereinafter, GeSbTe is referred to as GST alloy.

The GST alloy may be programmed to one of an amorphous (i.e., "reset" state representing relatively high resistivity) and a crystalline (i.e., "set" state representing relatively low resistivity) by heating the phase change layer 11. The "reset" state may correspond to logic "1", and the "set" state may correspond to logic "0". Alternatively, the "reset" state may correspond to logic "0", and the "set" state may correspond to logic "1".

In FIG. 1, when a pulse current I is applied to the phase change memory cell MC, the pulse current I may flow through the lower electrode 13. When the pulse current I is applied to the phase change memory cell MC for a time, portions of the phase change layer 11, adjacent to the lower electrode 13, may be heated by joule heat of the pulse current I. Accordingly, the portion (hatched portion of the phase change layer 11) may be transformed to one of the "reset" state and the "set" state according to a heating profile.

Figure 2:
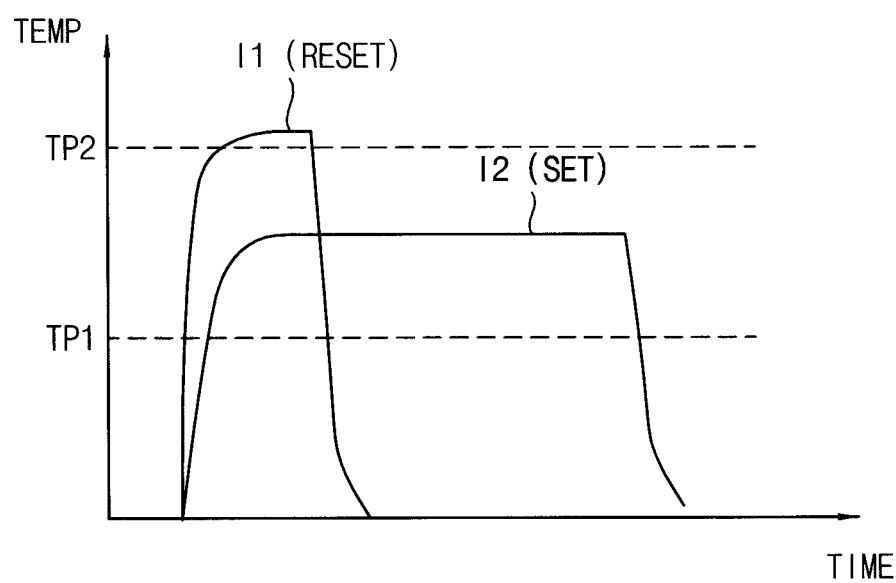

FIG. 2 is a graph illustrating model temperature profiles for a phase change memory cell as applied during a program operation.

Referring to FIG. 2, the phase change memory cell MC may be programmed to the reset state by applying a current (reset pulse) "I1" to the phase change memory cell MC for a first time period to heat the phase change layer 11 or a portion thereof to above a temperature TP2. After the phase change layer 11 or the portion thereof reaches the temperature TP2, the current "I1" may be removed from the phase change memory cell MC and the phase change layer 11 may rapidly cool. The phase change memory cell MC may be programmed to the set state by applying a current (set pulse) "I2" to the phase change memory cell MC for a second time period, which may be longer than the first time period, to heat the phase change layer 11 to above temperature TP1 and maintain the phase change layer 11 above the temperature TP1 through the second time period. Then, after the second time period, the current "I2" may be removed from the phase change memory cell MC, allowing the phase change layer 11 to cool. The temperature TP1 may represent a crystallization temperature of the phase change layer 11 and the temperature TP2 may represent a melting point of the phase change layer 11.

Figure 3:
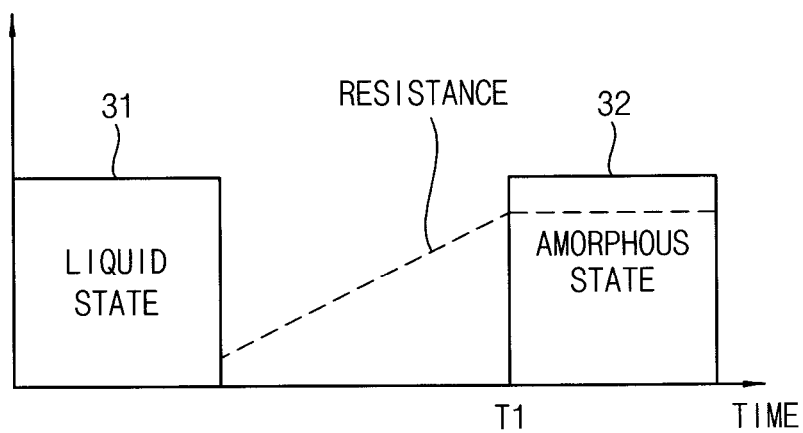

FIG. 3 is a graph illustrating a state change for a phase change material within a phase change memory cell.

Referring to FIG. 3, when the reset pulse (I1) is no longer applied to the phase change memory cell MC, the phase change layer 11 may be transformed from liquid state 31 to the amorphous state 32. While the phase change layer 11 is transformed from liquid state 31 to the amorphous state 32, a resistance of the phase change layer 11 may gradually increase with time. That is, the resistance of the phase change layer 11 may drift. As illustrated in FIG. 3, it may take a time T1 (e.g., tens of microseconds to 100 microseconds) for the phase change material of the phase change layer 11 to be stabilized to the amorphous state 32 from the liquid state 31.

Alternatively, as illustrated in FIG. 2, when the phase change memory cell MC is programmed to the set state, the set pulse (I2) may be applied to the phase change memory cell MC for the second time period so that the phase change material of the phase change layer 11 may stabilize to the crystalline state.

Therefore, when the phase change memory cell MC is reset or programmed, a stabilization time may be required for the phase of the phase change material to stabilize from a start of the programming.

A conventional phase change memory device may output a write complete signal to an external device (e.g., a memory controller) after waiting the stabilization time from a start of applying the pulse current I to the phase change memory cell MC. Therefore, much time may be required to program data in the conventional phase change memory device.

On the other hand, as will be described hereinbelow, a phase change memory device according to an example embodiment may output the write complete signal to an external device (e.g., a memory controller) immediately after applying the pulse current I (e.g., I1 or I2) without waiting the stabilization time. As such, the phase change memory device according to an example embodiment may exhibit a relatively faster programming speed.

Hereinafter, the phase change memory device according to an example embodiment will be described with reference to FIGS. 4 to 7.

Figure 4:
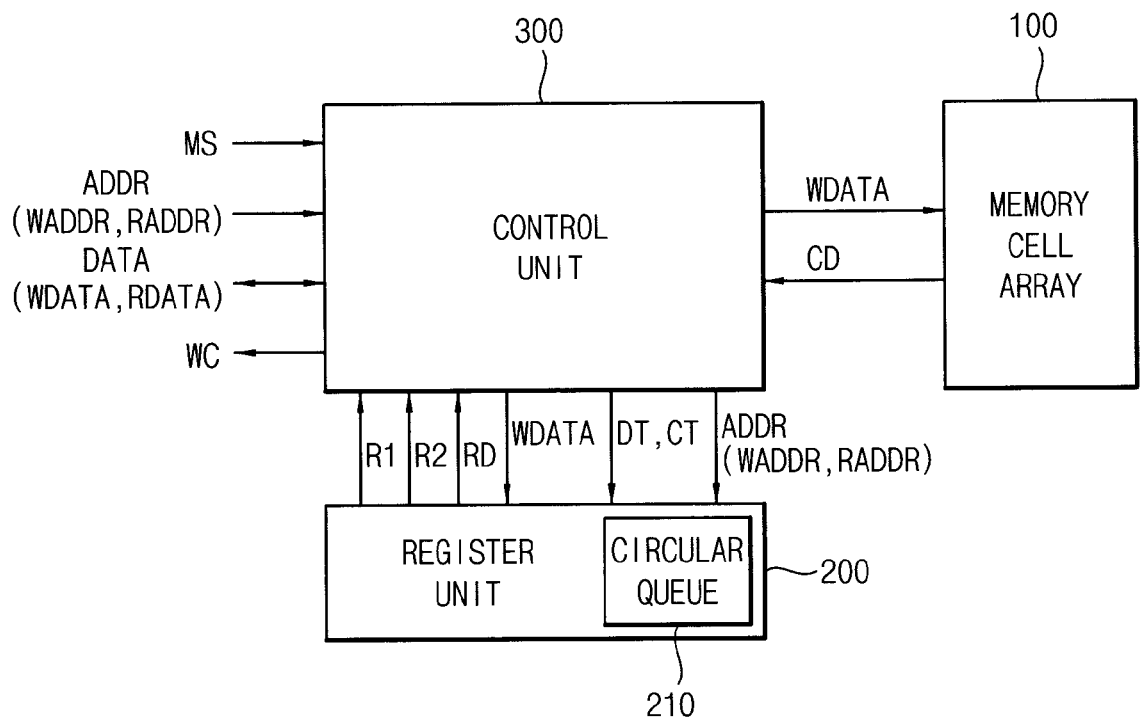

FIG. 4 is a block diagram illustrating a phase change memory device according to an example embodiment.

Referring to FIG. 4, a phase change memory device 40 may include a memory cell array 100, a register unit 200 and a control unit 300.

The memory cell array 100 may include a plurality of phase change memory cells. The plurality of phase change memory cells may be implemented with the phase change memory cell MC 10 of FIG. 1.

The register unit 200 may include a circular queue 210. The circular queue 210 may be used as a cache for temporarily storing data that may be programmed in the plurality of phase change memory cells.

The control unit 300 may communicate with an external device (e.g. a memory controller) by receiving and/or transmitting a mode signal MS, an address signal ADDR and/or a data signal DATA. The control unit 300 may operate in a write mode or in a read mode according to a logic level of the mode signal MS. For example, the control unit 300 may operate in the write mode when the mode signal MS is in a logic high level, and operate in the read mode when the mode signal MS is in a logic low level. Alternatively, the control unit 300 may operate in the write mode when the mode signal MS is in a logic low level, and operate in the read mode when the mode signal MS is in a logic high level. The control unit 300 may perform a program operation and output a write complete signal WC, which may represent a completion of the program operation, to the external device in the write mode. The control unit 300 may perform a read operation in the read mode.

In the write mode, the control unit 300 may receive a write address WADDR and a write data WDATA. The control unit 300 may program the write data WDATA in a phase change memory cell corresponding to the write address WADDR among the plurality of phase change memory cells by applying one of the reset pulse I1 and the set pulse I2 to the phase change memory cell based on a logic level of the write data WDATA. At the same time, the control unit 300 may provide the write address WADDR and the write data WDATA to the register unit 200, and may receive a first result signal R1 from the register unit 200. The control unit 300 may output the write complete signal WC before a phase of the phase change memory cell is stabilized or after the phase of the phase change memory cell is stabilized based on a logic level of the first result signal R1. That is, the control unit 300 may output the write complete signal WC without waiting the stabilization time, which is a time required for the phase of the phase change memory cell to be stabilized from a start of applying the pulse current I, or after waiting the stabilization time based on a logic level of the first result signal R1.

When the register unit 200 receives the write address WADDR and the write data WDATA from the control unit 300, the register unit 200 may determine whether an oldest entry of the circular queue 210 is deletable or not. If the oldest entry of the circular queue 210 is deletable, the register unit 200 may store the write address WADDR and the write data WDATA in the oldest entry of the circular queue 210 and provide the first result signal R1 having a first logic level to the control unit 300. If the oldest entry of the circular queue 210 is not deletable, the register unit 200 may provide the first result signal R1 having a second logic level to the control unit 300 without storing the write address WADDR and the write data WDATA in the circular queue 210. The first logic level may be a logic high level and the second logic level may be a logic low level. Alternatively, the first logic level may be a logic low level and the second logic level may be a logic high level.

The control unit 300 may output the write complete signal WC before the phase of the phase change memory cell is stabilized when the first result signal R1 has the first logic level. That is, the control unit 300 may output the write complete signal WC immediately without waiting the stabilization time when the first result signal R1 has the first logic level.

On the other hand, the control unit 300 may output the write complete signal WC after the phase of the phase change memory cell is stabilized when the first result signal R1 has the second logic level. That is, the control unit 300 may output the write complete signal WC after waiting the stabilization time from a start of the program operation, in which the control unit 300 may apply the pulse current I to the phase change memory cell, when the first result signal R1 has the second logic level.

Figure 5:
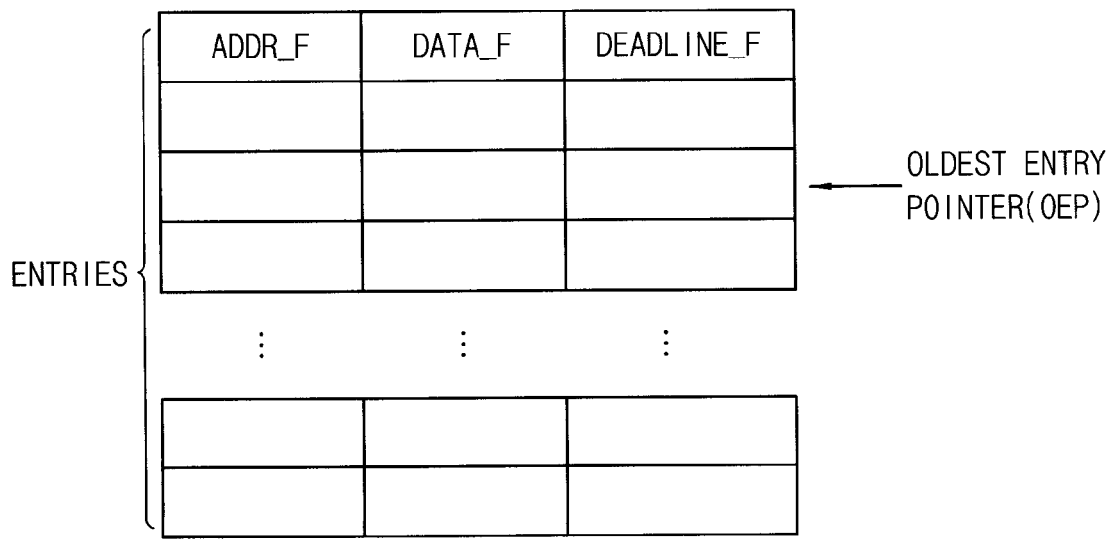

FIG. 5 is a diagram illustrating a circular queue included in a register unit of FIG. 4 according to an example embodiment.

Referring to FIG. 5, the circular queue 210 may include a plurality of entries. Each of the entries may include an address field ADDR_F, a data field DATA_F and a deadline field DEADLINE_F.

In the write mode, the control unit 300 may generate a deadline time DT by adding the stabilization time to a current time CT, and provide the current time CT and the deadline time DT along with the write address WADDR and the write data WDATA to the register unit 200 when the control unit 300 starts to program the write data WDATA in the phase change memory cell. The current time CT may represent a time at which the program operation is started by applying the pulse current I (e.g., I1 or I2) to the phase change memory cell. The deadline time DT may represent a time at which the phase of the phase change memory cell is stabilized.

The address field ADDR_F, the data field DATA_F and the deadline field DEADLINE_F of the circular queue 210 may store the write address WADDR, the write data WDATA and the deadline time DT, respectively, received from the control unit 300. The deadline time DT may represent a time from which the corresponding entry of the circular queue 210 is deletable.

The register unit 200 may include an oldest entry pointer OEP, which may indicate an oldest entry among the plurality of entries included in the circular queue 210. When the register unit 200 receives the current time CT, the deadline time DT, the write address WADDR and the write data WDATA from the control unit, the register unit 200 may determine whether the oldest entry of the circular queue 210 is deletable or not by comparing the current time CT received from the control unit 300 with an oldest deadline time, which may be read from the deadline filed DEADLINE_F of the oldest entry in the circular queue 210, to generate the first result signal R1.

When the current time CT is equal to or later than the deadline filed DEADLINE_F of the oldest entry in the circular queue 210 (i.e., the oldest deadline time), the phase of the phase change memory cell, which may correspond to the write address WADDR stored in the address field ADDR_F of the oldest entry, may be stabilized. Therefore, the register unit 200 may determine that the oldest entry, which may be indicated by the oldest entry pointer OEP, is deletable, store the write address WADDR, the write data WDATA and the deadline time DT in the address field ADDR_F, the data field DATA_F and the deadline field DEADLINE_F of the oldest entry, respectively, and provide the first result signal R1 having the first logic level to the control unit 200. The register unit 200 may then move the oldest entry pointer OEP to the next entry when the oldest entry pointer OEP does not indicate the last entry of the circular queue 210, and move the oldest entry pointer OEP to the first entry of the circular queue 210 when the oldest entry pointer OEP indicates the last entry of the circular queue 210.

When the current time CT is earlier than the oldest deadline time, the phase of the phase change memory cell, which may correspond to the write address WADDR stored in the address field ADDR_F of the oldest entry, is not yet stabilized. Therefore, the register unit 200 may determine that the oldest entry, which is indicated by the oldest entry pointer OEP, is not deletable, and provide the first result signal R1 having the second logic level to the control unit 200 without storing the write address WADDR, the write data WDATA and the deadline time DT in the circular queue 210.

If the first result signal R1 has the first logic level, the control unit 300 may output the write complete signal WC immediately without waiting the stabilization time since the write address WADDR and the write data WDATA may be stored in the circular queue 210. On the other hand, if the first result signal R1 has the second logic level, the control unit 300 may output the write complete signal WC after waiting the stabilization time since the write address WADDR and the write data WDATA may not be stored in the circular queue 210.

In the read mode, the control unit 300 may receive a read address RADDR, and output one of a register data RD read from the circular queue 210 and a cell data CD read from the memory cell array 100 as a read data RDATA to the external device based on whether the read address RADDR is stored in the circular queue 210.

In one example embodiment, when the control unit 300 receives the read address RADDR in the read mode, the control unit 300 may perform a read operation on a phase change memory cell corresponding to the read address RADDR among the plurality of phase change memory cells, and provide the read address RADDR to the register unit 200 at the same time. The control unit 300 may receive the cell data CD from the memory cell array 100 as a result of the read operation.

When the register unit 200 receives the read address RADDR from the control unit 300, the register unit 200 may determine whether the read address RADDR is stored in the address field ADDR_F of an entry of the circular queue 210. If the read address RADDR is stored in an entry of the circular queue 210, the register unit 200 may provide, to the control unit 300, a second result signal R2 having a first logic level and the register data RD, which may be read from the data field DATA_F of the entry storing the read address RADDR in the circular queue 210. If the circular queue 210 contains multiple entries where the read address RADDR is stored in the address field ADDR_F, the register unit 200 may provide, to the control unit 300, a second result signal R2 having a first logic level and the register data RD may be read from the newest entry (e.g., the most recently added entry, the entry with the latest deadline time DT, or the entry temporally farthest from the oldest entry pointer OEP) in the circular queue 210 where the read address RADDR is stored in the address field ADDR_F. If the read address RADDR is not stored in the circular queue 210, the register unit 200 may provide the second result signal R2 having a second logic level to the control unit 300.

The control unit 300 may output the register data RD received from the register unit 200 to the external device as the read data RDATA when the second result signal R2 has the first logic level. The control unit 300 may output the cell data CD received from the memory cell array 100 to the external device as the read data RDATA when the second result signal R2 has the second logic level. For this operation, the control unit 300 may include a multiplexer 310, for example.

Figure 6:
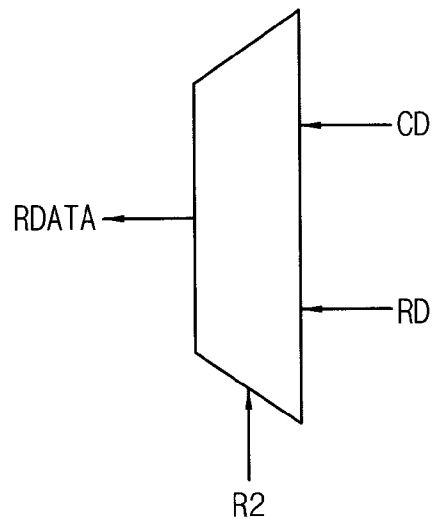

FIG. 6 is a block diagram illustrating a multiplexer included in a control unit of FIG. 4 according to an example embodiment.

Referring to FIG. 6, the multiplexer 310 may receive the register data RD from the register unit 200 and the cell data CD from the memory cell array 100 as input signals, and receive the second result signal R2 as a control signal. The multiplexer 310 may output the register data RD as the read data RDATA when the second result signal R2 has the first logic level, and output the cell data CD as the read data RDATA when the second result signal R2 has the second logic level.

The control unit 300 may receive the register data RD from the register unit 200 earlier in time than the cell data CD that may be provided from the memory cell array 100 as a result of the read operation. Therefore, the control unit 300 may stop the read operation when the second result signal R2 has the first logic level.

In one example embodiment, when the control unit 300 receives the read address RADDR in the read mode, the control unit 300 may provide the read address RADDR to the register unit 200 before performing the read operation on the phase change memory cell corresponding to the read address RADDR among the plurality of phase change memory cells. If the control unit 300 receives the second result signal R2 having the first logic level from the register unit 200, the control unit 300 may output the register data RD received from the register unit 200 as the read data RDATA. If the control unit 300 receives the second result signal R2 having the second logic level from the register unit 200, the control unit 300 may perform the read operation on the phase change memory cell corresponding to the read address RADDR among the plurality of phase change memory cells, and output the cell data CD received from the memory cell array 100 as a result of the read operation as the read data RDATA.

As described above, in the write mode, the control unit 300 may program the write data WDATA in the phase change memory cell corresponding to the write address WADDR among the plurality of phase change memory cells by applying the pulse current Ito the phase change memory cell, and, at the same time, store the write address WADDR and the write data WDATA to the register unit 200. Therefore, the control unit 300 may output the write complete signal WC to the external device (e.g., a memory controller) immediately after applying the pulse current I without waiting the stabilization time. As such, the phase change memory device 40 according to an example embodiment may exhibit a relatively faster programming speed.

If the phase change memory device 40 performs the read operation on a phase change memory cell after a program operation but before a phase of the phase change memory cell is stabilized, the phase change memory device 40 may not output a correct data stored in the phase change memory cell.

The control unit 300 may output the write complete signal WC to the external device (e.g., a memory controller) immediately after applying the pulse current I without waiting the stabilization time only when the register unit 200 stores the write address WADDR and the write data WDATA in the circular queue 210. Therefore, if the control unit 300 receives the read address RADDR, which may correspond to a phase change memory cell before the phase of the phase change memory cell is stabilized, the control unit 300 may output the register data RD read from the circular queue 210 as the read data RDATA instead of the cell data CD read from the memory cell array 100. To guarantee that the write address WADDR and the write data WDATA are stored in the circular queue 210 until the phase of the phase change memory cell is stabilized, the deadline time DT, which is generated by adding the stabilization time to the current time CT, may be stored in the circular queue 210 along with the write address WADDR and the write data WDATA. The register unit 200 may not overwrite the write address WADDR and the write data WDATA with a newer queue entry until the deadline time DT passes. As such, the phase change memory device 40 according to an example embodiment may perform the read operation correctly although the phase change memory device 40 outputs the write complete signal WC to the external device (e.g., a memory controller) before the phase of the phase change memory cell is stabilized in the write mode.

Figure 7:
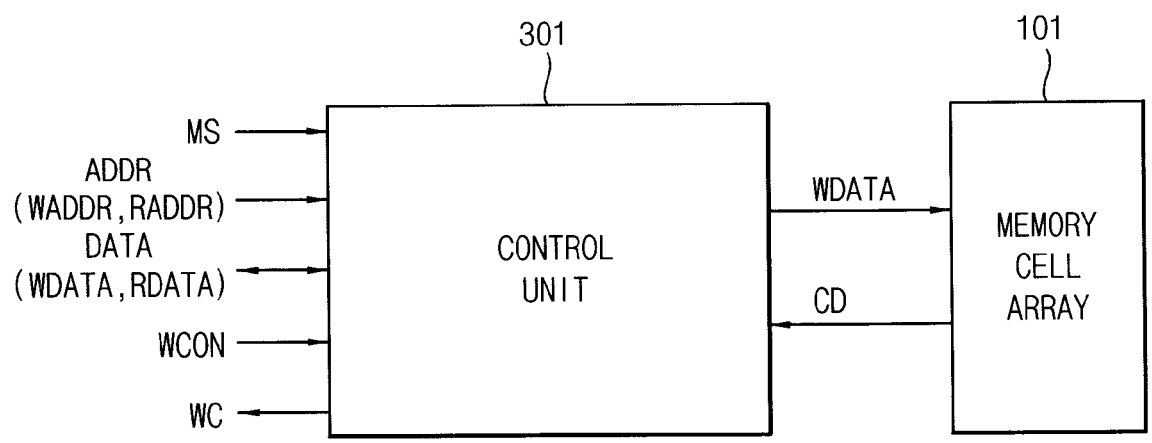

FIG. 7 is a block diagram illustrating a phase change memory device according to an example embodiment.

Referring to FIG. 7, a phase change memory device 50 may include a memory cell array 101 and a control unit 301.

Comparing the phase change memory device 50 of FIG. 7 with the phase change memory device 40 of FIG. 4, the phase change memory device 50 does not include the register unit 200.

The memory cell array 101 may include a plurality of phase change memory cells. The plurality of phase change memory cells may be implemented with the phase change memory cell MC 10 of FIG. 1. The memory cell array 101 of FIG. 7 may have the same structure as the memory cell array 100 of FIG. 4.

The control unit 301 may communicate with an external device (e.g. a memory controller) by receiving and/or outputting a mode signal MS, an address signal ADDR and a data signal DATA. The control unit 300 may operate in a write mode or in a read mode according to a logic level of the mode signal MS. For example, the control unit 301 may operate in the write mode when the mode signal MS is in a logic high level, and operate in the read mode when the mode signal MS is in a logic low level. Alternatively, the control unit 300 may operate in the write mode when the mode signal MS is in a logic low level, and operate in the read mode when the mode signal MS is in a logic high level. The control unit 301 may perform a program operation and output a write complete signal WC, which may represent a completion of the program operation to the external device in the write mode. The control unit 301 may control a time at which the control unit 301 outputs the write complete signal WC based on a write control signal WCON received from the external device. The control unit 301 may perform a read operation in the read mode.

In the write mode, the control unit 301 may receive a write address WADDR, a write data WDATA and the write control signal WCON. The control unit 301 may program the write data WDATA in a phase change memory cell corresponding to the write address WADDR among the plurality of phase change memory cells by applying one of the reset pulse I1 and the set pulse I2 to the phase change memory cell based on a logic level of the write data WDATA. The control unit 301 may output the write complete signal WC before a phase of the phase change memory cell is stabilized or after the phase of the phase change memory cell is stabilized based on a logic level of the write control signal WCON. For example, the control unit 301 may output the write complete signal WC immediately (i.e., without waiting the stabilization time, which is a time required for the phase of the phase change memory cell to be stabilized from a start of applying the pulse current I) when the write control signal WCON has a first logic level. The control unit 301 may output the write complete signal WC after waiting the stabilization time when the write control signal WCON has a second logic level.

In the read mode, the control unit 301 may receive a read address RADDR, perform a read operation on a phase change memory cell corresponding to the read address RADDR among the plurality of phase change memory cells, and output a cell data CD received from the memory cell array 101 as a result of the read operation as a read data RDATA to the external device.

If the phase change memory device 50 performs the read operation on a phase change memory cell after a program operation but before a phase of the phase change memory cell is stabilized, the phase change memory device 50 may not output a correct data stored in the phase change memory cell. Therefore, when the external device performs the program operation on the phase change memory device 50 by providing the write address WADDR and the write data WDATA along with the write control signal WCON having the first logic level to the phase change memory device 50, it may be required for the external device not to read the write data WDATA again from the phase change memory device 50 within the stabilization time since a start of the program operation.

Figure 8:
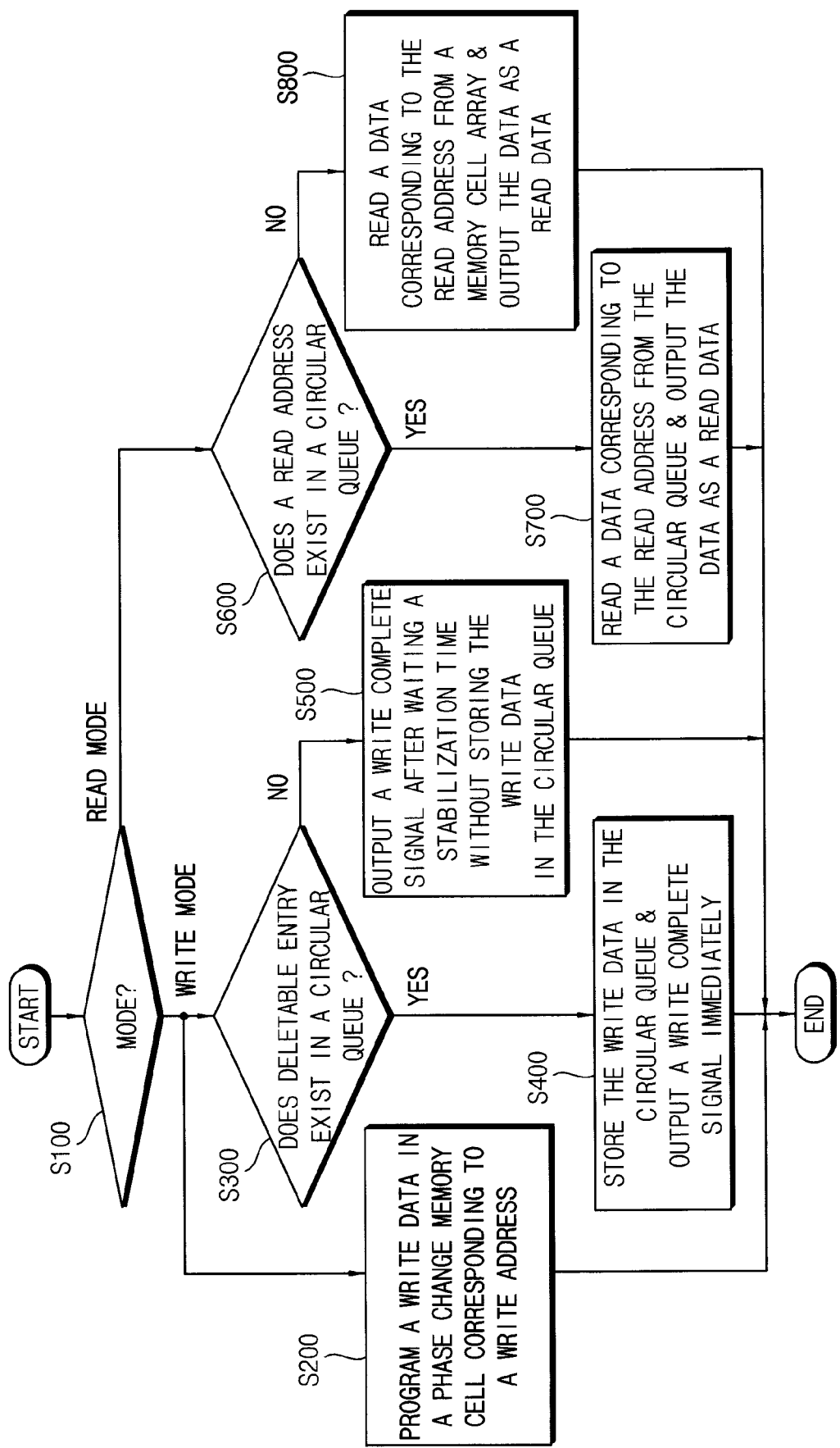

FIG. 8 is a flow chart illustrating a method of programming and reading in a phase change memory device according to an example embodiment.

The phase change memory device includes a memory cell array having a plurality of phase change memory cells. The plurality of phase change memory cells may be implemented with the phase change memory cell MC 10 of FIG. 1. The phase change memory device includes a circular queue used as a cache temporary storing data that are programmed in the plurality of phase change memory cells.

Referring to FIG. 8, the phase change memory device may operate in a write mode or in a read mode according to a logic level of a mode signal received from an external device (e.g., a memory controller) (S100).

The phase change memory device may include a memory cell array having a plurality of phase change memory cells. The plurality of phase change memory cells may be implemented with the phase change memory cell MC 10 of FIG. 1.

The phase change memory device may include a circular queue used as a cache for temporarily storing data programmed in the plurality of phase change memory cells.

In the write mode, the phase change memory device may receive a write address and a write data. The phase change memory device may program the write data in a phase change memory cell corresponding to the write address among the plurality of phase change memory cells by applying one of the reset pulse I1 and the set pulse I2 to the phase change memory cell based on a logic level of the write data (S200). At the same time, the phase change memory device may determine whether an oldest entry of the circular queue is deletable or not (S300). If the oldest entry of the circular queue is deletable, the phase change memory device may store the write address and the write data in the oldest entry of the circular queue and output a write complete signal representing a completion of the program operation immediately without waiting a stabilization time, which is a time required for the phase of the phase change memory cell to be stabilized from a start of applying the pulse current I (S400). If the oldest entry of the circular queue is not deletable, the phase change memory device may output the write complete signal after waiting the stabilization time without storing the write address and the write data in the circular queue (S500).

The phase change memory device may generate a deadline time by adding the stabilization time to a current time, which may be the time the program operation is started by applying the pulse current I to the phase change memory cell, and store the deadline time along with the write address and the write data in the circular queue. The phase change memory device may determine whether the oldest entry of the circular queue is deletable or not by comparing the current time with an oldest deadline time, which may be read from the oldest entry of the circular queue.

For example, when the current time is equal to or later than the oldest deadline time, the phase of the phase change memory cell, which may correspond to the write address stored in the oldest entry, may be stabilized already. Therefore, the phase change memory device may determine that the oldest entry is deletable, store the write address, the write data and the deadline time in the oldest entry, and output the write complete signal immediately without waiting the stabilization time.

When the current time is earlier than the oldest deadline time, the phase of the phase change memory cell, which may correspond to the write address stored in the oldest entry, may not yet be stabilized. Therefore, the phase change memory device may determine that the oldest entry may not be deletable, and output the write complete signal after waiting the stabilization time and without storing the write address, the write data and the deadline time in the circular queue.

In the read mode, the phase change memory device may receive a read address, and determine whether the read address may be stored in the circular queue (S600).

If the read address is stored in the circular queue, the phase change memory device may read a data from an entry of the circular queue that stores the read address and output the data to the external device as a read data (S700). If the circular queue contains multiple entries where the read address is stored therein, the phase change memory device may read the data from an entry of the circular queue that stores the newest entry (e.g., the most recently added entry, the entry with the latest deadline time, or the entry temporally farthest from the oldest entry pointer).

If the read address is not stored in the circular queue, the phase change memory device may perform a read operation on the memory cell array to read a data stored in a phase change memory cell corresponding to the read address and output the data to the external device as the read data (S800).

In one example embodiment, when the phase change memory device receives the read address in the read mode, the phase change memory device may start to perform the read operation on a phase change memory cell corresponding to the read address among the plurality of phase change memory cells, and, at the same time, the phase change memory device may determine whether the read address is stored in the circular queue. If the read address is stored in the circular queue, the phase change memory device may read a data from an entry of the circular queue that stores the read address, output the data to the external device as the read data, and stop the read operation. If the read address is not stored in the circular queue, the phase change memory device may output a data received from the memory cell array as a result of the read operation to the external device as the read data.

In one example embodiment, when the phase change memory device receives the read address in the read mode, the phase change memory device may determine whether the read address is stored in the circular queue before performing the read operation on a phase change memory cell corresponding to the read address among the plurality of phase change memory cells. If the read address is stored in the circular queue, the phase change memory device may read a data from an entry of the circular queue that stores the read address, and output the data to the external device as the read data. If the read address is not stored in the circular queue, the phase change memory device may perform the read operation on a phase change memory cell corresponding to the read address among the plurality of phase change memory cells, and output a data received from the memory cell array as a result of the read operation to the external device as the read data.

The method of programming and reading the phase change memory device in FIG. 8 may be performed by the phase change memory device 40 of FIG. 1, for example. A structure and an operation of the phase change memory device 40 of FIG. 1 are described above with reference to FIGS. 1 to 6. Therefore, a detailed description of steps in FIG. 8 will be omitted.

As described above, according to the method of programming and reading the phase change memory device of FIG. 8, the phase change memory device may program the write data in the phase change memory cell corresponding to the write address among the plurality of phase change memory cells by applying the pulse current I to the phase change memory cell, and, at the same time, store the write address and the write data to the circular queue. Therefore, the phase change memory device may output the write complete signal to the external device (e.g., a memory controller) immediately after applying the pulse current I without waiting the stabilization time. As such, the method of programming and reading the phase change memory device of FIG. 8 may exhibit a relatively faster programming speed.

If the phase change memory device performs the read operation on a phase change memory cell after a program operation but before a phase of the phase change memory cell is stabilized, the phase change memory device may not output a correct data stored in the phase change memory cell.

In the method of programming and reading the phase change memory device of FIG. 8, the phase change memory device may output the write complete signal to the external device (e.g., a memory controller) immediately after applying the pulse current I without waiting the stabilization time only when the phase change memory device stores the write address and the write data in the circular queue. Therefore, if the phase change memory device receives the read address, which may correspond to a phase change memory cell before the phase of the phase change memory cell is stabilized, the phase change memory device may output the data read from the circular queue as the read data instead of the data read from the memory cell array. To guarantee that the write address and the write data are stored in the circular queue until the phase of the phase change memory cell is stabilized, the deadline time, which may be generated by adding the stabilization time to the current time, may be stored in the circular queue along with the write address and the write data. The phase change memory device may not overwrite the write address and the write data until the deadline time passes. As such, in the method of programming and reading the phase change memory device of FIG. 8, the read operation may be performed correctly although the phase change memory device outputs the write complete signal to the external device (e.g., a memory controller) before the phase of the phase change memory cell is stabilized in the write mode.

Figure 9:
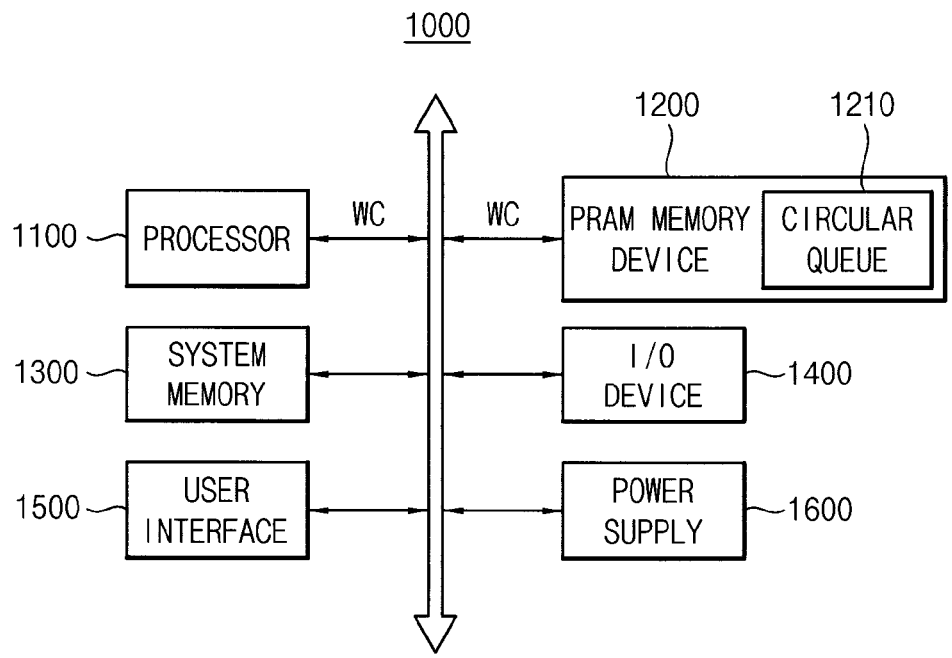

FIG. 9 is a block diagram illustrating a computing system according to an example embodiment.

Referring to FIG. 9, a computing system 1000 may include a processor 1100 and a phase change memory device 1200.

The processor 1100 may control an operation of the phase change memory device 1200. The processor 1100 may perform various computing functions, such as executing specific software for performing specific calculations or tasks. The processor 1100 may be a microprocessor or a central process unit, for example. The processor 1100 may be connected to the phase change memory device 1200 via a bus such as an address bus, a control bus or a data bus, for example. The processor 1100 may be connected to an extended bus, such as peripheral component interconnect (PCI) bus, for example.

The processor 1100 may be embodied as a single core architecture or a multi core architecture. For example, the processor 1100 may be embodied as a single core architecture when an operating frequency of the processor 1100 is less than 1 GHz, and the processor 1100 may be embodied as a multi core architecture when an operating frequency of the processor 1100 is greater than 1 GHz. A multi core architecture processor 1100 may communicate with peripheral devices via an advanced extensible interface (AXI) bus.

The phase change memory device 1200 may include a memory cell array having a plurality of phase change memory cells. The plurality of phase change memory cells may be implemented with the phase change memory cell MC 10 of FIG. 1. The phase change memory device 1200 may include a circular queue 1210 used as a cache for temporarily storing data that are programmed in the plurality of phase change memory cells.

In the write mode, the phase change memory device 1200 may receive a write address and a write data from the processor 1100. The phase change memory device 1200 may program the write data in a phase change memory cell corresponding to the write address among the plurality of phase change memory cells by applying one of the reset pulse I1 and the set pulse I2 to the phase change memory cell based on a logic level of the write data. At the same time, the phase change memory device 1200 may determine whether an oldest entry of the circular queue 1210 is deletable or not. If the oldest entry of the circular queue 1210 is deletable, the phase change memory device 1200 may store the write address and the write data in the oldest entry of the circular queue 1210 and output a write complete signal WC, which represents a finish of the program operation, to the processor 1100 immediately without waiting a stabilization time, which is a time required for the phase of the phase change memory cell to be stabilized from a start of applying the pulse current I. If the oldest entry of the circular queue 1210 is not deletable, the phase change memory device 1200 may output the write complete signal WC to the processor 1100 after waiting the stabilization time without storing the write address and the write data in the circular queue 1210.

The phase change memory device 1200 may be embodied with the phase change memory device 40 of FIG. 4. A structure and an operation of the phase change memory device 40 of FIG. 4 are described above with reference to FIGS. 1 to 6. Therefore, a detailed description of the phase change memory device 1200 will be omitted.

The computing system 1000 may further include a system memory 1300, an input/output device 1400, a user interface 1500 and a power supply 1600. Although not illustrated in FIG. 9, the computing system 1000 may further include ports to communicate with a video card, a sound card, a memory card, a universal serial bus (USB) device, for example.

The system memory 1300 may store data for operations of the computing system 1000. For example, the system memory 1300 may include at least one volatile memory device such as a dynamic random access memory (DRAM) device, a static random access memory (SRAM) device, etc. and/or at least one non-volatile memory device such as an erasable programmable read-only memory (EPROM) device, an electrically erasable programmable read-only memory (EEPROM) device, a flash memory device, etc.

The input/output device 1400 may include an input device (e.g., a keyboard or a mouse) and/or an output device (e.g., a printer or a monitor). The user interface 1500 may include devices required for a user to interface with and/or control the computing system 1000. The power supply 1600 may provide operational power.

The computing system 1000 may comprise any of several types of electronic devices, such as a mobile device, a smart phone, a cellular phone, a personal digital assistant (PDA), a desktop computer, a laptop computer, a work station, a handheld device, a personal media player (PMP), a digital camera, or the like.

As described above, the computing system 1000 according to an example embodiment may be able to perform next operations (i.e., programming and/or reading) immediately without waiting the stabilization time when the computing system 1000 writes a data to the phase change memory device 1200 since the phase change memory device 1200 outputs the write complete signal WC immediately without waiting the stabilization time. As such, the computing system 1000 may exhibit a relatively faster operation speed.

Figure 10:
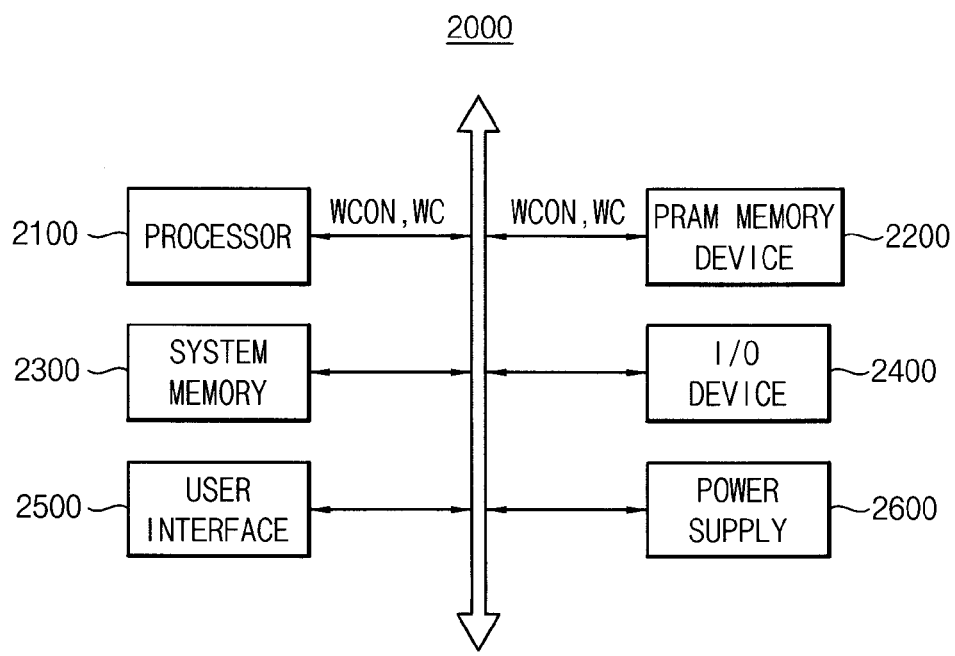

FIG. 10 is a block diagram illustrating a computing system according to an example embodiment.

Referring to FIG. 10, a computing system 2000 may include a processor 2100 and a phase change memory device 2200.

The processor 2100 may control an operation of the phase change memory device 2200. For example, the processor 2100 may provide a write control signal WCON to the phase change memory device 2200 to control a program operation of the phase change memory device 2200. The processor 2100 may perform various computing functions, such as executing specific software for performing specific calculations or tasks. The processor 2100 may be a microprocessor or a central process unit, for example. The processor 2100 may be connected to the phase change memory device 2200 via a bus such as an address bus, a control bus or a data bus, for example. The processor 2100 may be connected to an extended bus, such as peripheral component interconnect (PCI) bus, for example.

The processor 2100 may be embodied as a single core architecture or a multi core architecture. For example, the processor 2100 may be embodied as a single core architecture when an operating frequency of the processor 2100 is less than 1 GHz, and the processor 2100 may be embodied as a multi core architecture when an operating frequency of the processor 2100 is greater than 1 GHz. The processor 2100 that is embodied as a multi core architecture may communicate with peripheral devices via an advanced extensible interface (AXI) bus.

The phase change memory device 2200 may include a memory cell array having a plurality of phase change memory cells. The plurality of phase change memory cells may be implemented with the phase change memory cell MC 10 of FIG. 1.

In the write mode, the phase change memory device 2200 may receive a write address, a write data and the write control signal WCON from the processor 2100. The phase change memory device 2200 may program the write data in a phase change memory cell corresponding to the write address among the plurality of phase change memory cells by applying one of the reset pulse I1 and the set pulse I2 to the phase change memory cell based on a logic level of the write data. The phase change memory device 2200 may output the write complete signal WC to the processor 2100 before a phase of the phase change memory cell is stabilized or after the phase of the phase change memory cell is stabilized based on a logic level of the write control signal WCON. For example, the phase change memory device 2200 may output the write complete signal WC to the processor 2100 immediately without waiting the stabilization time, which is a time required for the phase of the phase change memory cell to be stabilized from a start of applying the pulse current I, when the write control signal WCON has a first logic level. The phase change memory device 2200 may output the write complete signal WC to the processor 2100 after waiting the stabilization time when the write control signal WCON has a second logic level.

The phase change memory device 2200 may be embodied with the phase change memory device 50 of FIG. 7. As described above with reference to FIG. 7, if the phase change memory device 2200 performs the read operation on a phase change memory cell after a program operation but before a phase of the phase change memory cell is stabilized, the phase change memory device 2200 may not output a correct data stored in the phase change memory cell. Therefore, when the processor 2100 performs the program operation on the phase change memory device 2200 by providing the write address and the write data along with the write control signal WCON having the first logic level to the phase change memory device 2200, it may be required for the processor 2100 not to read the write data again from the phase change memory device 2200 within the stabilization time since a start of the program operation.

To guarantee that the processor 2100 does not read the write data again from the phase change memory device 2200 within the stabilization time since the program operation, the computing system 2000 may further include a system memory 2300 that may store data for operations of the processor 2100.

The processor 2100 may provide the write control signal WCON having the first logic level to the phase change memory device 2200 when the write data is already stored in the system memory 2300. When the processor 2100 needs the write data within the stabilization time since a start of the program operation, the processor 2100 may read the write data from the system memory 2300 instead of the phase change memory device 2200.

On the other hand, the processor 2100 may provide the write control signal WCON having the second logic level to the phase change memory device 2200 when the write data is not stored in the system memory 2300.

The system memory 2300 may include at least one volatile memory device such as a dynamic random access memory (DRAM) device, a static random access memory (SRAM) device, etc. and/or at least one non-volatile memory device such as an erasable programmable read-only memory (EPROM) device, an electrically erasable programmable read-only memory (EEPROM) device, a flash memory device, etc.

The phase change memory device 2200 may be embodied with the phase change memory device 50 of FIG. 7. A structure and an operation of the phase change memory device 50 of FIG. 7 are described above with reference to FIGS. 1, 2, 3 and 7. Therefore, a detailed description of the phase change memory device 2200 will be omitted.

The computing system 2000 may further include an input/output device 2400, a user interface 2500 and a power supply 2600. Although not illustrated in FIG. 10, the computing system 2000 may further include ports to communicate with a video card, a sound card, a memory card, a universal serial bus (USB) device, for example.

The input/output device 2400 may include an input device (e.g., a keyboard or a mouse), and/or an output device (e.g., a printer or a monitor). The user interface 2500 may include devices required for a user to interface with and/or control the computing system 2000. The power supply 2600 may provide operational power.

The computing system 2000 may comprise any of several types of electronic devices, such as a mobile device, a smart phone, a cellular phone, a personal digital assistant (PDA), a desktop computer, a laptop computer, a work station, a handheld device, a personal media player (PMP), a digital camera, or the like.

As described above, the computing system 2000 according to an example embodiment may be able to perform next operations (i.e., programming and/or reading) immediately without waiting the stabilization time when the computing system 2000 writes a data, which is already stored in the system memory 2300, to the phase change memory device 2200. As such, the computing system 2000 may increase an operation speed.

While example embodiments have been particularly shown and described, it will be understood by one of ordinary skill in the art that variations in form and detail may be made therein without departing from the spirit and scope of the claims.

What is claimed is:

1. A phase change memory device, comprising:
    a memory cell array including a plurality of phase change memory cells;
    a register unit including a circular queue; and
    a control unit configured to receive a write address and write data in a write mode, the control unit configured to program the write data in a phase change memory cell among the plurality of phase change memory cells based on the write address, to provide the write address and the write data to the register unit, and to output a write complete signal before a phase of the phase change memory cell is stabilized or after the phase of the phase change memory cell is stabilized based on a logic level of a first result signal received from the register unit.

2. The phase change memory device of claim 1, wherein the register unit is configured to provide the first result signal having a first logic level to the control unit when the register unit writes the write address and the write data in the circular queue, and to provide the first result signal having a second logic level to the control unit when the register unit does not write the write address and the write data in the circular queue.

3. The phase change memory device of claim 2, wherein the control unit is configured to output the write complete signal before the phase of the phase change memory cell is stabilized when the first result signal has the first logic level, and to output the write complete signal after the phase of the phase change memory cell is stabilized when the first result signal has the second logic level.

4. The phase change memory device of claim 1, wherein the control unit is configured to generate a deadline time by adding a stabilization time to a current time and to provide the current time and the deadline time to the register unit when the control unit starts to program the write data in the phase change memory cell, the stabilization time being a time required for the phase of the phase change memory cell to be stabilized from a start of the programming.

5. The phase change memory device of claim 4, wherein each entry included in the circular queue includes:
an address field configured to store the write address;
a data field configured to store the write data; and
a deadline field configured to store the deadline time.

6. The phase change memory device of claim 5, wherein the register unit is configured to compare the current time with an oldest deadline time, which is read from the deadline filed of an oldest entry in the circular queue, to determine the logic level of the first result signal.

7. The phase change memory device of claim 6, wherein the register unit is configured to provide the first result signal having a first logic level to the control unit and to store the write address, the write data and the deadline time in the address field, the data field and the deadline field of the oldest entry in the circular queue, respectively, when the current time is equal to or later than the oldest deadline time, and to provide the first result signal having a second logic level to the control unit without storing the write address, the write data and the deadline time in the circular queue when the current time is earlier than the oldest deadline time.

8. The phase change memory device of claim 1, wherein the control unit is configured to receive a read address in a read mode, and to output one of a register data read from the circular queue and a cell data read from the memory cell array as a read data based on whether the read address is stored in the circular queue.

9. The phase change memory device of claim 1, wherein the control unit is configured to receive a read address in a read mode, to perform a read operation on a phase change memory cell corresponding to the read address among the plurality of phase change memory cells, and to provide the read address to the register unit.

10. The phase change memory device of claim 9, wherein the register unit is configured to provide a second result signal having a first logic level and a register data, which is read from the data field of an entry storing the read address in the circular queue, to the control unit when the circular queue stores the read address, and to provide the second result signal having a second logic level to the control unit when the circular queue does not store the read address.

11. The phase change memory device of claim 10, wherein the control unit is configured to output the register data received from the register unit as a read data when the second result signal has the first logic level, and to output a cell data received from the memory cell array as a result of the read operation as the read data when the second result signal has the second logic level.

12. The phase change memory device of claim 11, wherein the control unit is configured to stop the read operation when the second result signal has the first logic level.

13. A computing system, comprising:
a phase change memory device including a plurality of phase change memory cells; and
a processor configured to control an operation of the phase change memory device,
wherein the phase change memory device is configured to receive a write address, a write data and a write control signal from the processor in a write mode, to program the write data in a phase change memory cell among the plurality of phase change memory cells based on the write address, and to provide a write complete signal to the processor before a phase of the phase change memory cell is stabilized or after the phase of the phase change memory cell is stabilized based on a logic level of the write control signal.

14. The computing system of claim 13, further comprising:
a system memory configured to store a data required for an operation of the processor,
wherein the processor is configured to provide the write control signal having a first logic level to the phase change memory device when the write data is stored in the system memory, and to provide the write control signal having a second logic level to the phase change memory device when the write data is not stored in the system memory.

15. The computing system of claim 14, wherein the phase change memory device is configured to provide the write complete signal to the processor before the phase of the phase change memory cell is stabilized when the write control signal has the first logic level, and to provide the write complete signal to the processor after the phase of the phase change memory cell is stabilized when the write control signal has the second logic level.

16. A phase change memory, in response to writing received data to a phase change memory cell of a memory cell array based on a received address, configured to output a write complete signal, wherein the write complete signal is outputted
(1) before a phase of the phase change memory cell is stabilized or
(2) after the phase of the phase change memory cell is stabilized if a deletable entry does not exist in a queue.

17. The phase change memory of claim 16, further configured to:
determine, when a mode of operation is read, whether the queue contains an entry matching the address;
read a read data, in response to a determination that the queue does not contain the entry matching the address, from cell data of the memory cell array corresponding to the address;
read the read data, in response to a determination that the queue does contain the entry matching the address, from queue data corresponding to the address; and
transmit the read data.

18. The phase change memory of claim 16, wherein the queue is a circular queue.

19. The phase change memory of claim 16, further configured to:
determine, if a mode of operation is program, whether an oldest entry of the queue is deletable;

write the write data and the address, in response to a determination that the oldest entry of the queue is deletable, to the queue;
transmit the write complete signal immediately after the write data and the address are written to the queue; and
wait a stabilization time, in response to a determination that the oldest entry of the queue is not deletable, without storing the data and the address to the queue.

20. The phase change memory of claim 16, further configured to:
determine a write control when a mode of operation is program;
wait a stabilization period if the write control is a first level; and
not wait a stabilization period if the write control is a second level.

* * * * *